United States Patent [19]

Broadbent

[11] Patent Number: 4,495,221

[45] Date of Patent: Jan. 22, 1985

[54] VARIABLE RATE SEMICONDUCTOR DEPOSITION PROCESS

[75] Inventor: Eliot K. Broadbent, San Jose, Calif.

[73] Assignee: Signetics Corporation, Sunnyvale, Calif.

[21] Appl. No.: 436,863

[22] Filed: Oct. 26, 1982

[51] Int. Cl.[3] .................. B05D 5/12

[52] U.S. Cl. .................. 427/88; 427/90; 427/91; 427/255.7

[58] Field of Search .................. 427/88, 90, 91, 255.7

[56] References Cited

U.S. PATENT DOCUMENTS 3,934,059 1/1976 Polinsky .................. 427/90

*Primary Examiner*—John E. Kittle
*Assistant Examiner*—James J. Seidleck
*Attorney, Agent, or Firm*—R. Meetin; R. Mayer; T. A. Briody

[57] ABSTRACT

A layer of a conductive material consisting of aluminum alone or in combination with a small percentage of copper and/or silicon is formed on a semiconductor surface in a two-step deposition process in such a manner as to largely avoid serious continuity defects in the layer.

10 Claims, 12 Drawing Figures

SOURCE 10
$\theta=\theta_{MAX}$
90°
90°
14
12
14
$\mu=0°$ 10
14
$\theta_{MAX}$
90°
12
16
14
$\mu<90°-\theta_{MAX}$ 10
14
90°
$\theta_{MAX}$
12
14
16
$\mu=90°-\theta_{MAX}$ 10
$\theta=\theta_{MAX}$
90°
12
16
14
14
$90°-\theta_{MAX}<\mu<90°+\theta_{MAX}$ 10
14
90°
$\theta_{MAX}$
12
90°
14
16
$\mu=90°+\theta_{MAX}$ 10
$\theta_{MAX}$
90°
12
14
16
14
$\mu>90°+\theta_{MAX}$ 10
12
θ
26
24
36
16
36
14
22
90°
h
h
$t_2$
t
28
μ
$t_1$
32
30
34

DEPOSITION RATE - R(Å/SEC.)
20
15
10
5
0
42
40
0
5
10
20
25
TIME (MINUTES)

VARIABLE RATE SEMICONDUCTOR DEPOSITION PROCESS

FIELD OF USE

This invention relates generally to semiconductor manufacturing processes and more particularly to a method of forming a layer of an electrically conductive material on a surface of a semiconductor body.

BACKGROUND ART

In conventionally fabricating a semiconductor integrated circuit in which a generally flat semiconductor chip (or body) is housed in a suitable package, a thin pattern of an electrically conductive material connecting to the electrical leads of the package is formed on the chip to provide appropriate connection to the semiconductive elements in the chip. The conductive pattern is created by depositing a thin film (or layer) of the material on the chip and then removing the undesired portion of the film. The material is normally aluminum but may include a small percentage of copper and/or silicon with the Al. The weight percentage of Cu, if included, is no more than 4%. The same holds for Si.

One of the principal techniques for applying the thin conductive film on the body is evaporative deposition. In this technique, the chip is placed in a vacuum chamber containing a high-purity source of aluminum. If Cu and/or Si is also used, it may be supplied either from the Al source or separately. An electron beam is directed toward the source so as to cause part of it to vaporize. After opening a shutter between the source and body, atoms of the resulting vapor evaporate towards the chip where they accumulate to form the thin film. The chip is typically mounted on a planetary apparatus that rotates so as to improve the film coverage on the body which, although macroscopically flat, microscopically has numerous hills and valleys.

FIGS. 1*a*–1*f* generally illustrate the evaporative deposition process from a microscopic viewpoint in which only aluminum is deposited. A source 10 which is effectively a point-source insofar as the chip is concerned provides the Al. The evaporated Al atoms move in a direction 12 towards a surface 14 of the body. Macroscopically, surface 14 is substantially planar. A perpendicular to surface 14 as viewed macroscopically, or to those portions of surface 14 as viewed microscopically that are not inclined with respect to the general plane of the chip, is at an impingement angle $\theta$ to direction 12.

Impingement angle $\theta$ normally reaches a highest maximum value in one particular direction and a lowest maximum value in the opposite direction. These maxima are both represented as $\theta_{MAX}$ in FIGS. 1*a*–1*f*. In rotating three-dimensionally in the planetary, the chip then swings back and forth from about $\theta_{MAX}$ in one direction as represented by the solid-line versions of surface 14 in FIGS. 1*a*–1*f* to about $\theta_{MAX}$ in the opposite direction as indicated by the dashed-line versions of surface 14. The two values of $\theta_{MAX}$ depend on the location of the chip on the planetary. If it is optimized, $\theta_{MAX}$ is substantially constant at any of its chip locations at a value typically around 30°.

The slopes of the hills and valleys in surface 14 are roughly represented by inclined surface portons 16 (of which only one is shown in each of FIGS. 1*b*–1*f*) that each have a topographical surface angle $\mu$ relative to the general plane of the body—i.e., to the non-inclined portions of surface 14. Surface angle $\mu$ may be positive or negative, a positive $\mu$ value representing a valley while a negative $\mu$ value represents a hill. For convenience, negative $\mu$ values are not illustrated since hills are schematically equivalent to valleys here.

Shadowing occurs when atoms from source 10 cannot directly impinge on inclined portion 16 because a portion of the body along surface 14 is in the way. Depending on the value of $\mu$, inclined portion 16 may never be shadowed during a complete planetary rotation of the body, may be shadowed during part of the planetary rotation, or may be shadowed during the entire rotation. When inclined portion 16 is shadowed, the shadowed area also includes the underlying portion of surface 14 that portion 16 itself shadows. FIG. 1*a* represents the zero-point situation in which no shadowing occurs at all because the illustrated portion of surface 14 is microscopically flat. FIG. 1*b* indicates the case where $\mu$ is positive but less than $90°-\theta_{MAX}$ so that portion 16 is never shadowed. FIG. 1*c* represents the onset of shadowing where $\mu$ equals $90°-\theta_{MAX}$ as shown by the solid-line version of surface 14. FIG. 1*d* indicates the situation where $\mu$ lies between $90°-\mu_{MAX}$ and $90°+\theta_{MAX}$; as shown by the solid-line version of surface 14, portion 16 is shadowed during part of the planetary rotation. FIG. 1*e* represents the onset of complete shadowing where $\mu$ equals $90°+\theta_{MAX}$ as shown by both versions of surface 14. Finally, FIG. 1*f* indicates the case where $\mu$ is greater than $90°+\theta_{MAX}$; portion 16 is shadowed during the entire planetary rotation.

Generally, surface 14 is formed with $|\mu|$ not exceeding $90°+\theta_{MAX}$ anywhere so that no part of the body is completely shadowed during Al deposition. The cases shown in FIGS. 1*a*–1*d* up to FIG. 1*e* thus represent the overall situation of primary interest.

The vapor deposition rate R at which Al atoms from source 10 accumulate on surface 14 is conventionally constant at around 15 angstroms/second on the non-inclined portions of surface 14. FIG. 2 illustrates the duty cycle for such a prior art deposition process. In this process, the deposition-controlling shutter is opened shortly after source 10 is initially activated. This enables Al atoms from source 10 to impinge on surface 14 as the R rate rises rapidly to 15 angstroms/seconds while the body rotates in the planetary apparatus. When about 18,000 angstroms of Al have accumulated on surface 14, the shutter is closed to return the R rate to zero.

The 15-angstroms/second rate is moderately high, so chosen as to provide maximum throughput with good Al coverage. As long as there is substantially no shadowing —i.e., $|\mu|$ is less than $90°-\theta_{MAX}$ everywhere along surface 14, the resultant Al film is normally continuous and does not have serious continuity defects. However, when there is partial shadowing i.e., $|\mu|$ lies between $90°-\theta_{MAX}$ and $90°+\theta_{MAX}$ for some surface portions 16, continuity defects appear that seriously damage the integrity of the film. These defects include "thinning" in which the aluminum layer is so thin that cross-sectional current densities exceed design limits and "microcracking" in which cracks occur in the film due to insufficient coalescense of the Al grains. Another of these defects is "tunneling" in which gaps occur next to or under portions 16, especially those ones that are highly inclined. These defects need to be avoided.

DISCLOSURE OF THE INVENTION

In accordance with the invention, a layer of an electrically conductive material is formed on a surface of a semiconductor body by a variable rate deposition process in such a manner as to substantially reduce continuity defects such as tunneling, thinning, and/or microcracking in the layer. The material substantially consists of aluminum alone or in combination with no more than 4% by weight of copper and/or no more than 4% by weight of silicon.

In this method, atoms of the material are initially directed towards the surface to accumulate at a potentially variable first deposition rate whose average value $R_{1AVG}$ is sufficiently less than the average value $R_{2AVG}$ of a potentially variable second deposition rate that $I_{1AVG}/R_{1AVG}$ is not greater than one half $I_{2AVG}/R_{2AVG}$ where $I_{1AVG}$ and $I_{2AVG}$ are the average nucleation rates of atoms of the material on substantially non-inclined portions of the surface at the first and second deposition rates, respectively. Atoms of the material are subsequently directed towards the surface to accumulate at the second deposition rate to increase the average thickness of the layer to a selected thickness. The layer is preferably grown by evaporative deposition at a body temperature in the range of room temperature to 400° C.

The present method takes advantage of the enhancement of adatom migration of atoms of the material across the surface followed by resultant capture of the atoms at surface entrapment sites over nucleation growth of the material on the surface as the deposition rate is reduced. Where the surface has portions that are shadowed during part of the deposition cycle, the enhanced adatom migration during the first deposition step allows these partially shadowed portions to receive sufficient atoms of the material as to avoid tunneling, thinning, and/or microcracking. After the surface, including the partially shadowed portions, has been adequately covered to avoid these continuity defects, performance of the second deposition step at the higher deposition rate enables the throughput to be raised to a moderately high level. In short, the present method nearly achieves the throughput of the prior art while largely avoiding its disadvantages.

More particularly, the ratio of the average thickness of the material formed on the non-inclined portions during the initial deposition step to the height of the step profile along the surface is at least 0.25. This ratio is preferably not greater than 0.5. Even more particularly, the average thickness of the material formed on the non-inclined portions during the initial deposition step is in the range of 2,000–4,000 angstroms. The average deposition rate $R_{1AVG}$ of material deposited on the non-inclined portions during the first deposition step is preferably in the range of 2–10 angstroms/second and optimally in the range of 4–6 angstroms/second.

BRIEF DESCRIPTION OF THE DRAWINGS

Like reference symbols are employed in the drawings and in the description of the preferred embodiments to represent the same or very similar item or items.

DESCRIPTION OF THE PREFERRED EMBODIMENTS

Figure 1A:
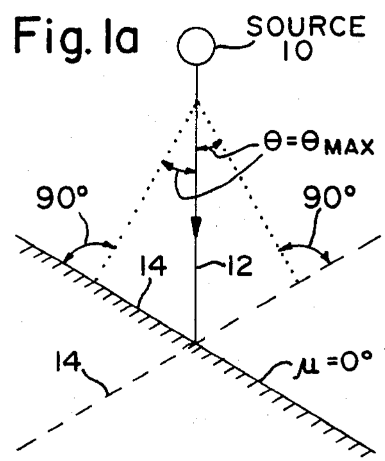
FIGS. 1*a*, 1*b*, 1*c*, 1*d*, 1*e*, and 1*f* are side views illustrating the impingement of Al atoms on a surface of a semiconductor body.
Figure 1B:
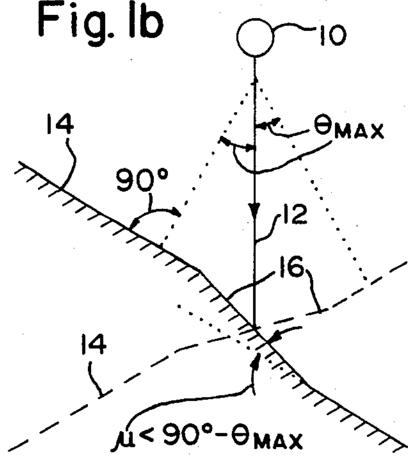
Figure 1C:
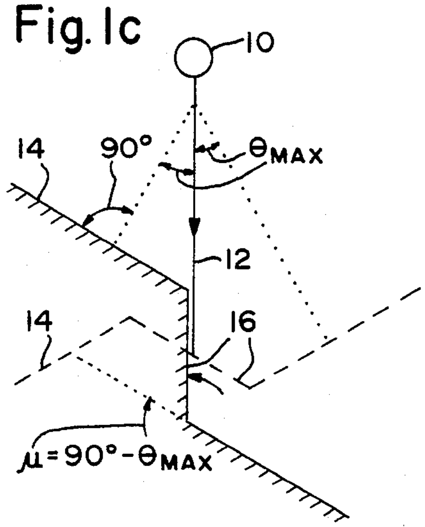
Figure 1D:
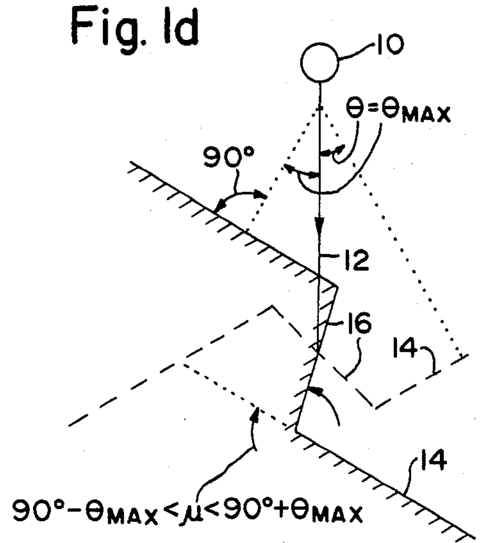
Figure 1E:
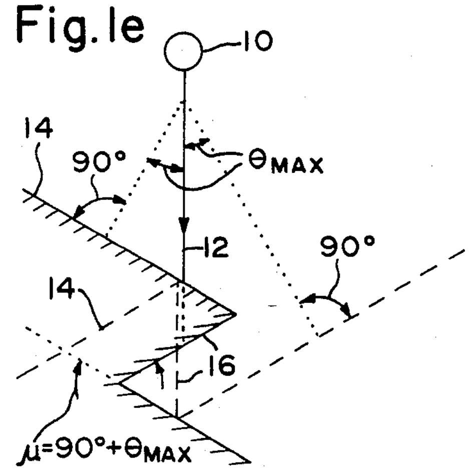
Figure 1F:
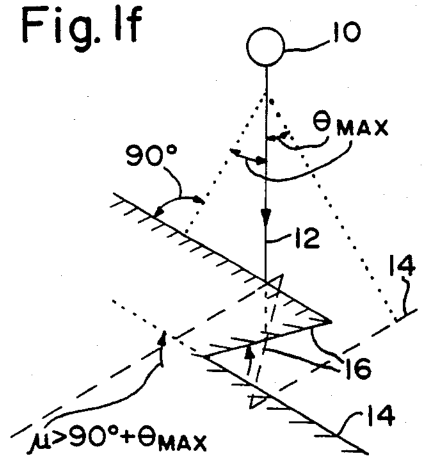
Figure 2:
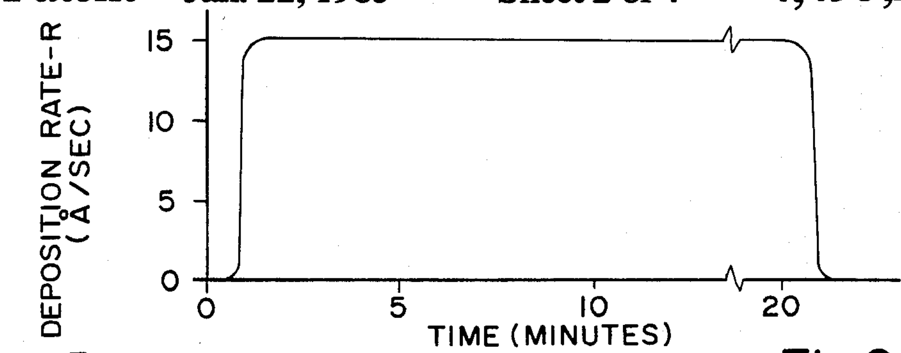
FIG. 2 is a time diagram of a prior art deposition rate for growing an Al layer on a semiconductor body.
Figure 3:
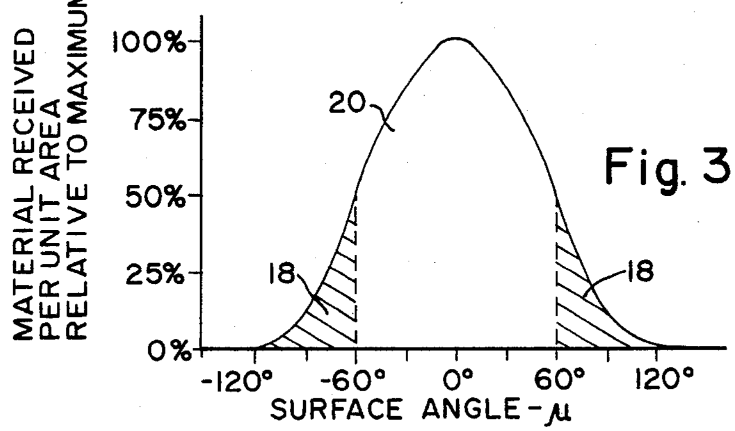
FIG. 3 is a graph of the amount of material received per unit area at the surface of a semiconductor body by direct impingement as a function of the surface angle for a planetary where the maximum impingement angle is 30°.
Figure 4:
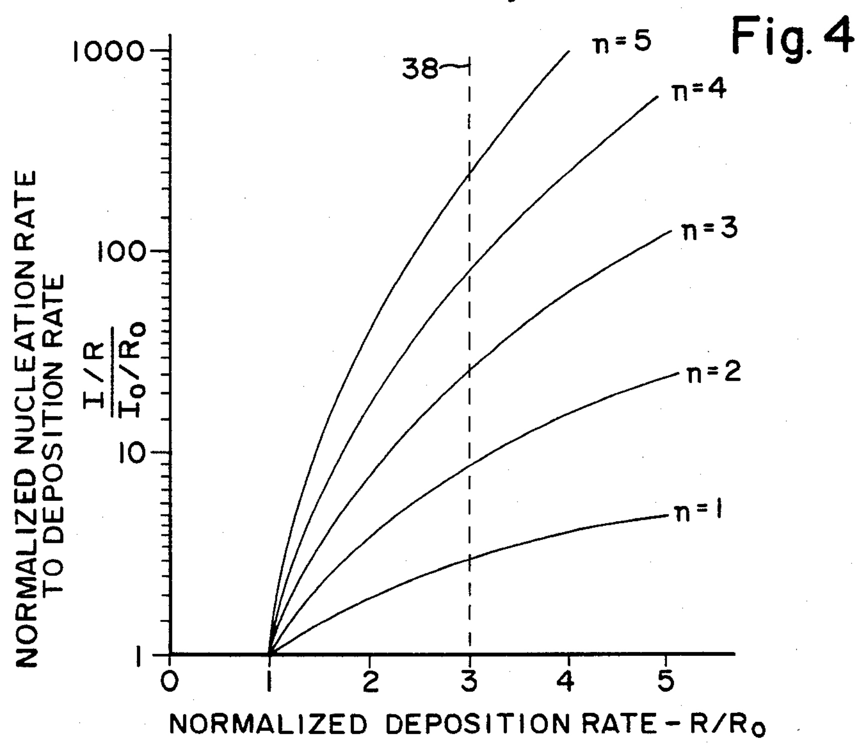
FIG. 4 is a graph of the ratio of normalized deposition rate to normalized nucleation rate as a function of normalized deposition rate for various values of the number of atoms in a critical nucleus.

Returning to FIGS. 1*a*–1*f*, the quantity of material received at any unit area of surface 14 by direct impingement along direction 12 varies with impingement angle $\theta$ (according to cos $\theta$) and surface angle $\mu$. For a given planetary duty cycle, the average amount of directly impinging material received per unit area at surface 14 can be calculated as a function of $\mu$. FIG. 3 illustrates such a calculation for a typical planetary duty cycle where $\theta_{MAX}$ is constant at 30°. The curve in FIG. 4 is the percentage of material received per unit area relative to the maximum amount of material received per unit area at $\mu=0°$. Shaded areas 18 indicate the surface portions shadowed during part of each planetary rotation (as in FIG. 1*d*), whereas unshaded area 20 indicates the surface portions never shadowed (as in FIG. 1*b*). As FIG. 3 shows, the amount of directly impinging material drops off relatively sharply as shadowing increasingly blocks off the line-of-sight vapor flux. This shows why direct impingement itself will not provide proper film coverage on surface 14 where $|\mu|$ is greater than 60° (i.e., $90°-\theta_{MAX}$).

As impinging atoms are adsorbed on surface 14 at areas whose underlying material differs from that of the impinging material, there are two principal competing phenomena. These are nucleation and adatom migration leading to capture at surface entrapment sites.

Nucleation occurs when two or more adsorbed atoms combine to form a cluster or nucleus which remains substantially stationary on surface 14. Although a nucleus may lose atoms, it generally increases in size as more atoms reach surface 14. There are n atoms in a "critical" nucleus for which the probability of gaining or losing an atom is equal. A "stable" nucleus is produced from a critical nucleus by adding one more atom.

The rate of formation of stable nuclei is termed the nucleation rate I which is $$I=FV^{n+1}e^{E_I/kT} \quad (1)$$

where F involves various chip conditions, V is the vapor impingement rate (in atoms per unit area per second), $E_I$ (which is normally positive) involves various activation/dissociation energies, k is Boltzmann's constant, and T is the chip temperature. Considering only the variation of nucleation rate I with impingement rate V as a function of critical number n, an examination of Eq. (1) indicates that a small decrease in V leads to a proportionally higher decrease in I even when n is as small as 1.

Vapor impingement rate V is directly proportional to deposition rate R. For homogeneous (i.e., constant) chip conditions at constant T, Eq. (1) can then be converted to $$\frac{I/R}{I_0/R_0} = \left(\frac{R}{R_0}\right)^n \quad (2)$$

where $I_O$ and $R_O$ are baseline values for I and R, respectively. The nucleation parameter I/R is employed in Eq. (2) to factor out the effect of more or less atoms impinging on surface 14 with changing deposition rate R. Eq. (2) is plotted in FIG. 4 for various values of n. For aluminum, n increases with temperature T from 1 to 5 or more as T ranges from about room temperature to 400° C.

Turning to adatom migration, the capture rate W at which single atoms migrating over surface 14 are caught and localized at low-energy entrapment sites is $$W = \frac{V}{N} e^{E_W/kT} \quad (3)$$

where N is the entrapment-site density on surface 14 and $E_W$ (which is normally positive) depends on various activation energies. Again assuming homogeneous chip conditions at constant T, Eq. (3) can be converted to $$\frac{W/R}{W_0/R_0} = 1 \quad (4)$$

where $W_O$ is a baseline value for W. Capture rate W is divided by R so as to factor out the effects of more or less atoms impinging on surface 14 as R varies. In short, the capture parameter W/R is constant. A comparison of Eqs. (2) and (4) shows that capture rate W can be enhanced relative to nucleation rate I by reducing impingement rate R.

Figure 5:
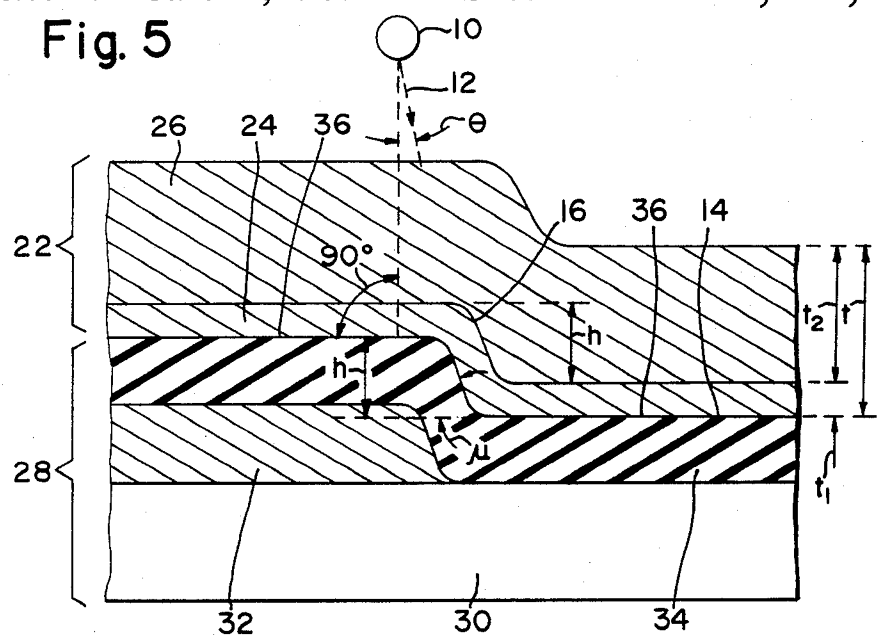
FIG. 5 is a cross-sectional side view of a semiconductor body on which a layer is formed in accordance with the invention.

Referring to FIG. 5, it illustrates a structure made according to the invention in which a homogeneous aluminum layer 22 consisting of a lower sub-layer 24 and an upper sub-layer 26 is formed on surface 14 of a semiconductor body 28 consisting of a semiconductive substrate region 30, an Al layer 32 partially overlying substrate region 30, and an insulating layer 34 of silicon dioxide overlying layer 32 and that portion of region 30 not covered by layer 32. Surface 14 is the top of oxide layer 34. Al layer 32 has a step profile which is reflected in oxide layer 34. This defines inclined surface portion 16 generally at surface angle $\mu$ relative to the non-inclined portions 36 of surface 14. Preferably, $|\mu|$ is not greater than $90°+\theta_{MAX}$. The heighth of the step profile is measured from left surface portion 36 to right surface portion 36 (or, equivalently, from the left top surface portion of sub-layer 24 to the right top surface portion of sub-layer 24).

Layer 22 is formed in two deposition steps with body temperature T lying in the range of room temperature to 400° C. and preferably about 300° C. The pressure is about $5\times10^{-6}$ torr or less. In the first deposition step, Al atoms from source 10 move towards surface 14 and accumulate there at a deposition rate $R_1$ to create sub-layer 24 having a thickness $t_1$ at non-inclined surface portions 36. $R_1$ may vary. In the second deposition step, Al atoms from source 10 move towards surface 14 and accumulate on sub-layer 24 at a deposition rate $R_2$ to form sub-layer 26 having a thickness $t_2$ above non-inclined portions 36. $R_2$ may vary. The average value $R_{2AVG}$ of deposition rate $R_2$ on the portions of sub-layer 24 above non-inclined portions 36 is about 15 angstroms/second which is sufficiently high to maximize the throughput.

During initial condensation on surface 14, impinging atoms have the highest probability of forming stable nuclei where their density is the greatest and where they directly impinge on surface 14. The probability of forming stable nuclei on inclined portions 16 and, in particular, on those portions of surface 14 that are shadowed during part of planetary rotation is lower. By slowing down nucleation rate I relative to capture rate W, these two probabilities are brought closer to each other. That is, reducing nucleation rate I enables a greater portion of the adsorbed Al atoms to travel across surface 14 and becomes fixed at the entrapment sites on surface portions that are partly shadowed. Nucleation is then enhanced at partly shadowed areas of surface 14. This prevents tunneling, thinning, and microcracking. After nucleation has occured across all of surface 14, it is no longer necessary to enhance capture rate W relative to nucleation rate I.

Sufficient equality across surface 14 is achieved by forming sub-layer 24 in such a manner that the average value $R_{1AVG}$ of deposition rate $R_1$ on non-inclined portions 36 is sufficiently less than average value $R_{2AVG}$ that $I_{1AVG}/R_{1AVG}$ is not greater than one half $I_{2AVG}/R_{2AVG}$. $I_{1AVG}$ is the average value of the nucleation rate $I_1$ of Al atoms on non-inclined portions 36 during the first step, and $I_{2AVG}$ is the average value of the corresponding nucleation rate $I_2$ which would occur if Al atoms were deposited directly on non-inclined portions 36 at deposition rate $R_2$. More particularly, $I_{1AVG}/R_{1AVG}$ is not greater than one third $I_{2AVG}/R_{2AVG}$. This condition, as shown by dashed line 38 in FIG. 4, largely assures that no serious continuity defects occur across surface 14. For example, if n equals 3, $I_{1AVG}/R_{1AVG}$ is about 1/27 of $I_{2AVG}/R_{2AVG}$ To attain a suitable continuous thin film, the first deposition step is performed until the ratio $t_1/h$ is at least 0.25 and preferably about 0.3. Thickness $t_1$ is not less than 2,000 angstroms. The first deposition step is not performed beyond the point at which $t_1/h$ exceeds 0.5 since nothing further is gained. That is, $t_1$ is not greater than 4,000 angstroms.

Consistent with the foregoing criteria, $R_{1AVG}$ is not less than 2 angstroms/second nor greater than 10 angstroms/second. Preferably, $R_{1AVG}$ is in the range of 4–6 angstroms/second.

Figure 6:
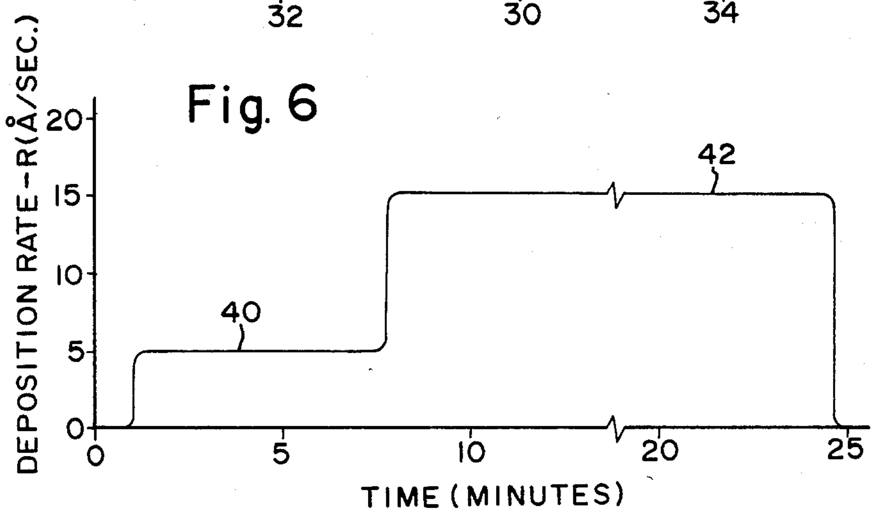
FIG. 6 is a time diagram of a deposition rate for growing the layer of FIG. 5.
Figure 7:
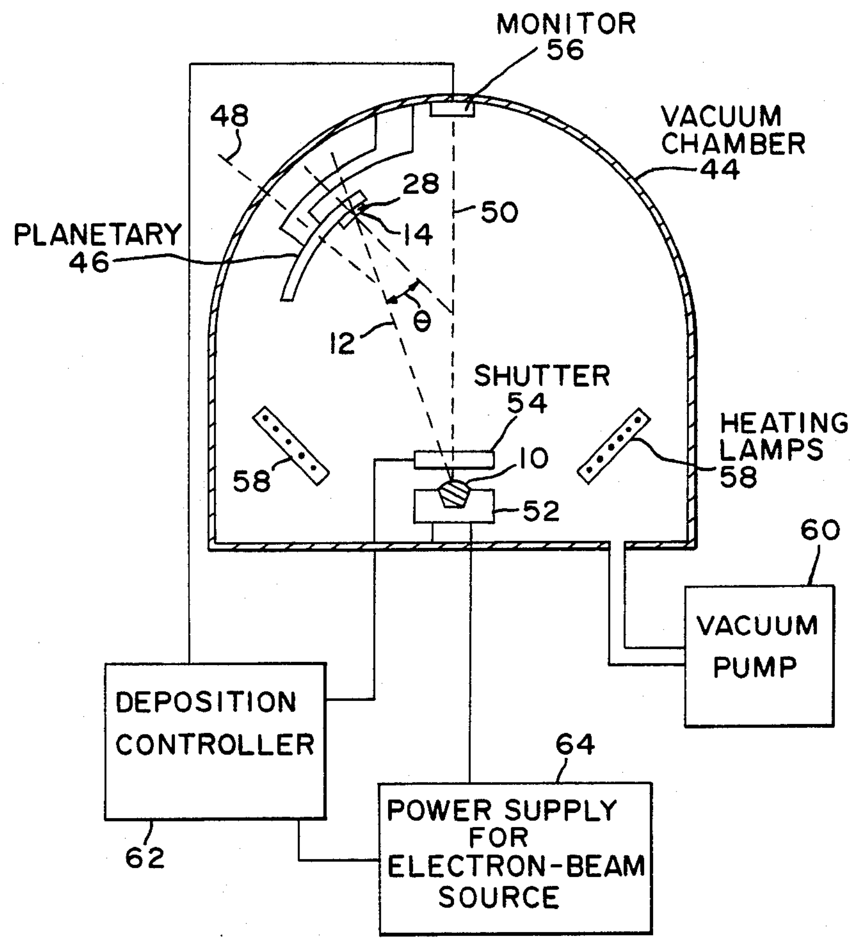
FIG. 7 is a schematic diagram of a vacuum evaporative deposition apparatus used to form the layer of FIG. 5.

FIG. 6 depicts a preferred duty cycle for deposition rate R. In this duty cycle, source 10 is first heated up for about 1 minute after which the deposition-controlling shutter is opened to allow evaporated aluminum atoms to impinge on surface 14. Sub-layer 24 is then formed at an $R_1$ level of 5 angstroms/second as indicated by line 40 until $t_1$ is 2,000 angstroms. Deposition rate R is then raised to an $R_2$ level of 15 angstroms/second as indicated by line 42 to form sub-layer 26 at $t_2$ equaling 16,000 angstroms. The shutter is then closed. The resulting total thickness t is about 18,000 angstroms.

Although the analysis in support of the above deposition steps was done specifically for aluminum, the analysis and consequently the method of forming layer 22 also apply to the situation in which Al is deposited with a small percentage of copper and/or silicon. In particular the deposited material may consist of Al with no more than 4% Cu and/or no more than 4% Si. Preferably, layer 22 is Al with about 1% Cu.

Any of a number of deposition systems may be utilized to form layer 22. FIG. 8 shows a schematic for a preferred arrangement of such a deposition system in which source 10 is enclosed in a vacuum chamber 44 containing a planetary apparatus 46 on which chip 28 is mounted. Planetary 46, which is curved, rotates about both its own axis 48 of curvature and the centerline 50 of chamber 44.

Al source 10 is mounted on a fixture 52 which also includes a source for electrons that are beamed at source 10. A shutter 54 lies between source 10 and planetary 46 so as to control evaporation toward body 28. A quartz crystal monitor 56 ascertains deposition rate R and, by integration, the average thickness of layer 22. Heating lamps 58 provide heat to control chip temperature T. A vacuum pump 60 is employed to evacuate chamber 48 to the desired evaporation pressure.

A deposition controller 62 responsive to monitor 56 regulates the amount of power which a power supply 64 provides to the electron-beam source in fixture 52. Controller 62 is preferably an Inficon IC 6000 instrument. An Inficon XMS instrument could be used as controller 62.

While the invention has been described with reference to particular embodiments, this description is solely for the purpose of illustration and it is not to be construed as limiting the scope of the invention claimed below. For example, the first impingement rate could increase linearly or otherwise vary with time. Thus, various modifications, changes, and applications may be made by those skilled in the art without departing from the true scope and spirit of the invention as defined by the appended claims.

What I claim is:

1. A method of forming a layer of an electically conductive material on a surface of a semiconductor body wherein the material substantially consists of aluminum with no more than 4% by weight of copper and no more than 4% by weight of silicon, characterized by the steps of:

initially directing atoms of the material toward the surface to accumulate there at a potentially variable first deposition rate whose average value $R_{1AVG}$ is not greater than 10 angstroms/second on substantially non-inclined portions of the surface and is sufficiently less than the average value $R_{2AVG}$ of a potentially variable second deposition rate that $I_{1AVG}/R_{1AVG}$ is not greater than one half $I_{2AVG}/R_{2AVG}$ where $I_{AVG}$ and $I_{2AVG}$ are the average nucleation rates of atoms of the material on the non-inclined portions at the first and second deposition rates, respectively; and subsequently directing atoms of the material toward the surface at the second deposition rate to increase the average thickness of the layer to a selected thickness, the temperature of the body being largely the same during both steps of directing.

2. A method as in claim 1 characterized in that the steps of directing are performed by evaporative deposition with the temperature of the body being in the range of room temperature to 400° C.

3. A method as in claim 2 wherein the surface has a step profile, characterized in that the ratio of the average thickness of the material formed on the non-inclined portion during the step of initially directing to the height of the step profile is at least 0.25.

4. A method as in claim 3 characterized in that said ratio is not greater than 0.5.

5. A method as in claim 2 characterized in that the average thickness of the material formed on the non-inclined portions during the step of initally directing is not less than 2,000 angstroms.

6. A method as in claim 5 characterized in that the average thickness of the material formed on the non-inclined portions during the step of initially directing is not greater than 4,000 angstroms.

7. A method as in claim 6 characterized in that $I_{1AVG}/R_{2AVG}$ is not greater than one third $I_{2AVG}/R_{2AVG}$.

8. A method as in claim 2 characterized in that $R_{1AVG}$ on the non-inclined portions is not less than 2 angstroms/second.

9. A method as in claim 2 characterized in that $R_{1AVG}$ on the non-inclined portions is in the range of 4 to 6 angstroms/second.

10. A method as in claim 2 wherein the surface has inclined surface portions that each have a topographical surface angle $\mu$ whose absolute value is not greater than $90°+\theta_{MAX}$ where $\theta_{MAX}$ is the maximum value of the impingement angle relative to a perpendicular to any of the non-inclined surface portions at which atoms of the material are directed, characterized in that adatom migration of atoms of the material across the surface is sufficiently dominant over nucleation growth of the material on the surface at the first deposition rate compared to the second deposition rate that continuity defects in the thickness of the material accumulated on the inclined portions that would otherwise result during the step of initially directing if it were performed at the second deposition rate are substantially reduced.

* * * * *